United States Patent
Lee et al.

(10) Patent No.: US 9,037,929 B2
(45) Date of Patent: May 19, 2015

(54) SEMICONDUCTOR MEMORY DEVICE AND METHOD OF OPERATING THE SAME

(75) Inventors: Jung Hwan Lee, Seoul (KR); Seong Je Park, Suwon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 3 days.

(21) Appl. No.: 13/225,621

(22) Filed: Sep. 6, 2011

(65) Prior Publication Data

US 2012/0060056 A1    Mar. 8, 2012

(30) Foreign Application Priority Data

Sep. 6, 2010 (KR) ........................ 10-2010-0087053

(51) Int. Cl.
*G11C 29/00* (2006.01)
*G11C 16/34* (2006.01)
*G11C 16/10* (2006.01)
*G06F 11/10* (2006.01)
*G11C 16/04* (2006.01)

(52) U.S. Cl.
CPC ........ *G11C 16/3459* (2013.01); *G11C 16/0483* (2013.01); *G11C 16/10* (2013.01); *G06F 11/1048* (2013.01)

(58) Field of Classification Search
USPC ........................ 714/15, 714, 54, E11.032, 719
See application file for complete search history.

(56) References Cited

U.S. PATENT DOCUMENTS

| | | | |
|---|---|---|---|
| 6,924,754 B2 * | 8/2005 | Seki ................................ | 341/94 |
| 2002/0088865 A1 * | 7/2002 | He et al. ......................... | 235/494 |
| 2004/0210803 A1 * | 10/2004 | Cheng et al. ................... | 714/710 |
| 2008/0031047 A1 * | 2/2008 | Ha ............................. | 365/185.17 |
| 2008/0055989 A1 * | 3/2008 | Lee et al. .................. | 365/185.09 |
| 2008/0072118 A1 * | 3/2008 | Brown et al. ................. | 714/763 |
| 2008/0212370 A1 * | 9/2008 | Tokiwa .................... | 365/185.09 |
| 2009/0158084 A1 * | 6/2009 | Merandat et al. ................. | 714/5 |

(Continued)

FOREIGN PATENT DOCUMENTS

| | | |
|---|---|---|
| JP | 20030059288 A | 2/2003 |
| KR | 10-0253707 B1 | 1/2000 |
| KR | 10-2008-0103783 A | 11/2008 |

OTHER PUBLICATIONS

Author: Rakan Maddah, Sangyeun Cho, and Rami Melhem; Title: Data Dependent Sparing to Manage Better-Than-Bad Blocks; Publisher: IEEE Computer Architecture Letters, vol. 12, No. 2, Jul.-Dec. 2013.*

*Primary Examiner* — Cynthia Britt
*Assistant Examiner* — Thien D Nguyen
(74) *Attorney, Agent, or Firm* — William Park & Associates Ltd.

(57) ABSTRACT

A method of operating a semiconductor memory device according to an aspect of the present disclosure includes performing a program loop, including a program operation and a program verification operation, in order to store input data in selected memory cells, performing a first error bit check operation for comparing the number of error bits of data not identical with the input data, with the number of correctable error bits, if the number of error bits is equal to or smaller than the number of correctable error bits, performing a second error bit check operation for comparing the number of error bits with the reference number of bits for replacement determination, and if the number of error bits is greater than the reference number of bits for replacement determination, updating failed column address information by adding the column address of a memory cell, having the error bits, to the failed column address information.

11 Claims, 2 Drawing Sheets

(56) References Cited

U.S. PATENT DOCUMENTS

2009/0199056 A1* 8/2009 Murata ........................ 714/704
2009/0210776 A1* 8/2009 Cho et al. ...................... 714/805
2010/0269000 A1* 10/2010 Lee .............................. 714/718
2010/0306582 A1* 12/2010 Han et al. ......................... 714/8

* cited by examiner

SEMICONDUCTOR MEMORY DEVICE AND METHOD OF OPERATING THE SAME

CROSS-REFERENCE TO RELATED APPLICATION

Priority to Korean patent application number 10-2010-0087053 filed on Sep. 6, 2010, the entire disclosure of which is incorporated by reference herein, is claimed.

BACKGROUND

Exemplary embodiments relate to a semiconductor memory device and a method of operating the same and, more particularly, to a semiconductor memory device applicable to nonvolatile memory devices and a method of operating the same.

After semiconductor memory devices are fabricated, a failed column may be selected by performing a test. In order to replace the failed column with redundancy column, failed column address information may be stored using a fuse or a Content-Addressable memory (CAM). However, many nonvolatile memory devices store redundancy information using the fuse. For this reason, although an additional failed column occur after packaging process, an update operation for adding the failed column address newly occurred to the failed column address information cannot be performed. Consequently, the entire memory chip cannot be used although the entire memory chip still has a redundant column.

BRIEF SUMMARY

According to exemplary embodiments of this disclosure, the lift span of a memory device and reliability of an operation of the memory device can be improved by performing an update operation for storing the column address of an additional failed column in failed column address information.

A semiconductor memory device according to an aspect of the present disclosure includes a memory array configured to include a memory block for storing input data and an extra block for storing failed column address information, an operation circuit group configured to perform a program loop for the memory block or the extra block, an error bit check circuit configured to compare the number of error bits of data not identical with the input data, with each of the number of correctable error bits and the reference number of bits for replacement determination, and a control circuit configured to control the operation circuit group in order to add the column address of a memory cell, having the error bits, to the failed column address information stored in the extra block, if the number of error bits is equal to or smaller than the number of correctable error bits and greater than the reference number of bits for replacement determination.

A method of operating a semiconductor memory device according to another aspect of the present disclosure includes performing a program loop, including a program operation and a program verification operation, in order to store input data in selected memory cells, performing a first error bit check operation for comparing the number of error bits of data not identical with the input data, with the number of correctable error bits, if the number of error bits is equal to or smaller than the number of correctable error bits, performing a second error bit check operation for comparing the number of error bits with the reference number of bits for replacement determination, and if the number of error bits is greater than the reference number of bits for replacement determination, updating failed column address information by adding the column address of a memory cell having the error bits, to the failed column address information.

DESCRIPTION OF EMBODIMENTS

Hereinafter, some exemplary embodiments of the present disclosure will be described in detail with reference to the accompanying drawings. The figures are provided to allow those having ordinary skill in the art to understand the scope of the embodiments of the disclosure.

Figure 1:
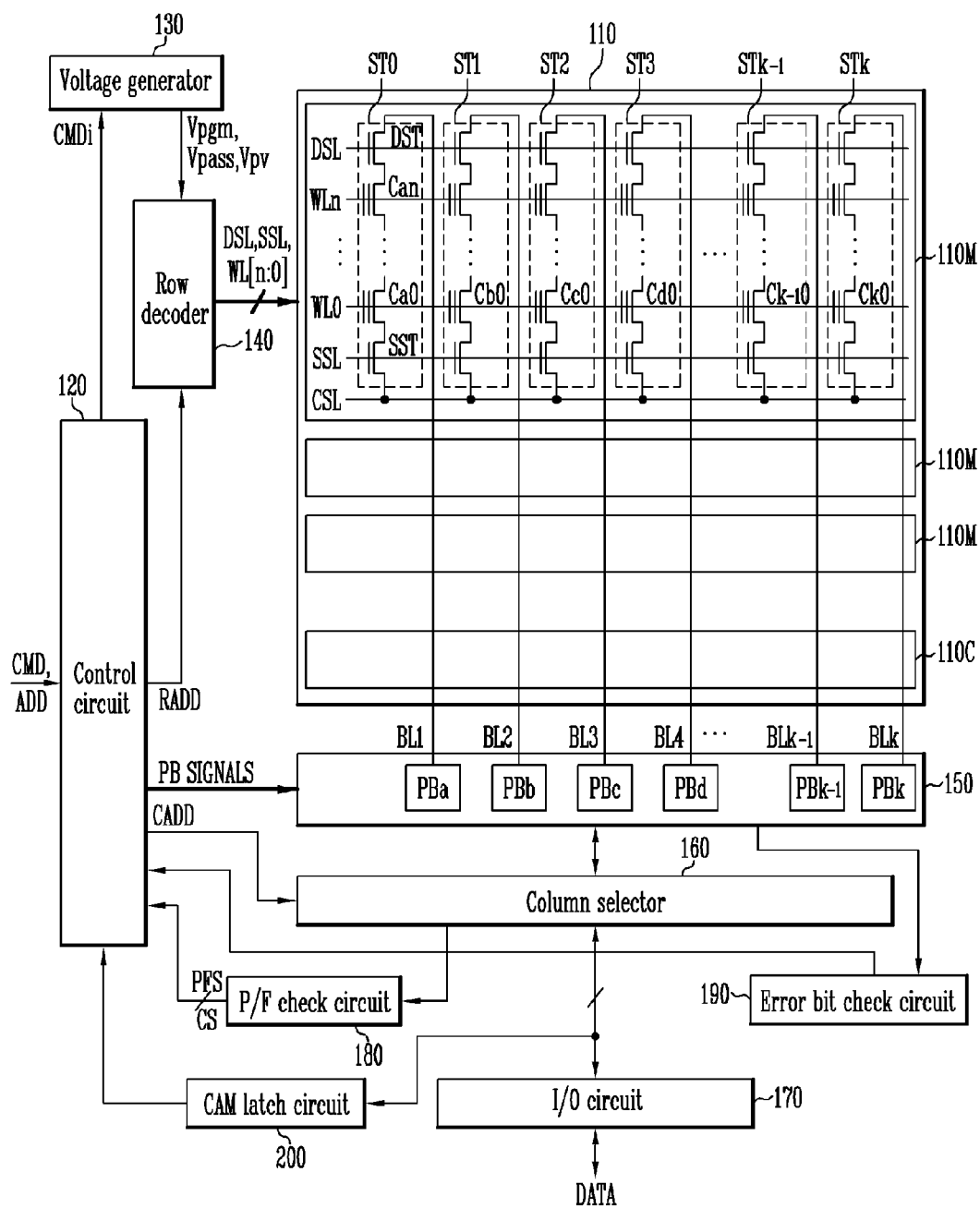
FIG. 1 is a circuit diagram of a semiconductor memory device according to an exemplary embodiment of this disclosure.

FIG. 1 is a circuit diagram of a semiconductor memory device according to an exemplary embodiment of this disclosure.

Referring to FIG. 1, the nonvolatile memory device according to the exemplary embodiment of this disclosure includes a memory array 110, an operation circuit group (130, 140, 150, 160, 170, and 180) for performing a program loop, an erasure loop, or a read operation for the memory cells of the memory array 110, an error bit check circuit 190, a control circuit 120 for controlling the operation circuit group (130, 140, 150, 160, 170, and 180) for performing the program loop, the erasure loop, or the read operation of the memory cells, and a CAM latch circuit 200. The program loop includes a program operation and a program verification operation.

The memory array 110 includes a plurality of memory blocks 110M for storing data and an extra block, e.g., a CAM block 110C for storing parameters including memory block information, such as failed column address information. The memory block 110M and the extra block 110C may have the same structure. For the sake of convenience, only one of the memory blocks is shown in detail in FIG. 1. Each of the memory blocks includes a plurality of strings ST0 to STk coupled between bit lines BL1 to BLk and a common source line CSL. That is, the strings ST1 to STk are coupled to the respective bit lines BL1 to BLk and are coupled to the common source line CSL.

Each (for example, ST0) of the strings includes a source select transistor SST configured to have a source coupled to the common source line CSL, a drain select transistor DST configured to have a drain coupled to the bit line BL1, and a plurality of memory cells Ca0 to Can coupled in series between the select transistors SST and DST. The gate of the source select transistor SST is coupled to a source select line SSL, the gates of the memory cells Ca0 to Can are coupled to respective word lines WL0 to WLn, and the gate of the drain select transistor DST is coupled to a drain select line DSL.

In a NAND flash memory device, the memory block may be divided into a plurality of physical pages, and each physical page may be divided into a plurality of logical pages. A page (or an even page and an odd page) is a basic unit for a program operation or a read operation.

For example, the memory cells Ca0 to Ck0 coupled to one word line (for example, WL0) constitutes one physical page. Furthermore, even-numbered memory cells Ca0 and Cc0 coupled to one word line (for example, WL0) may constitute an even physical page, and odd-numbered memory cells Cb0 and Cd0 coupled thereto may constitute one odd physical page.

Meanwhile, the number of logical pages included in each word line or each physical page is determined by the number of bits of data stored in a memory cell. For example, if data of 2 bits is stored in the memory cell, two logical pages may be included in one word line or one physical page. If data of 3 bits is stored in the memory cell, three logical pages may be included in one word line.

In a NAND flash memory device, the operation circuit group includes a voltage supply circuit (130, 140), a page buffer group 150, a column selector 160, an input/output (I/O) circuit 170, and a pass/fail (P/F) check circuit 180.

The voltage supply circuit (130, 140) generates operation voltages of various levels for a program loop for storing data in memory cells, an erasure loop for erasing data, or a read operation for reading data in response to an internal command signal CMDi generated by the control circuit 120 and supplies the generated operation voltages to the drain select line DSL, the word lines WL0 to WLn, and the source select line SSL of a selected memory block in response to a row address signal RADD. The voltage supply circuit includes a voltage generator 130 and a row decoder 140.

The voltage generator 130 outputs the operation voltages for the program loop, the erasure loop, or the read operation to global lines in response to the internal command signal CMDi of the control circuit 120. Also, the voltage generator 130 outputs operation voltages for a program (for example, Vpgm, Vpass, and Vpv) to the global lines when memory cells are programmed.

The row decoder 140 supplies the operation voltages generated at the voltage generator 130 to the local lines DSL, WL[n:0], and SSL of a selected memory block, selected from among the memory blocks of the memory array 110, in response to the row address signals RADD of the control circuit 120.

The page buffer group 150 includes page buffers PBa to PBk coupled to the respective bit lines BL1 to BLk. In the program loop, the page buffer group 150 supplies a certain voltages, necessary to program data into the memory cells Ca0 to Ck0, to the respective bit lines BL1 to BLk in response to the control signals PB SIGNALS of the control circuit 120. The page buffer group 150, for example, precharges the bit lines BL1 to BLk in the program loop, the erasure loop, or the read operation of the memory cells Ca0 to Ck0. Also, the page buffer group 150 latches a certain data according to a data to be programmed into the memory cells Ca0 to Ck0 in the program loop, or latches a certain data according to a data stored in the memory cells Ca0 to Ck0 in the read operation. That is, the page buffer group 150 controls the voltages of the bit lines BL1 to BLk based on data to be programmed into the memory cells Ca0 to Ck0, and detects data stored in the memory cells Ca0 to Ck0.

The column selector 160 selects the page buffers of the page buffer group 150 in response to a column address signal CADD generated by the control circuit 120. In the read operation, data latched in the page buffers selected by the column selector 160 is outputted.

The I/O circuit 170 transfers external input data to the column selector 160 under the control of the control circuit 120 in order to transfer the input data to the page buffer group 150 when a program operation is performed. When the column selector 160 sequentially transfers the received data to the page buffers of the page buffer group 150, the page buffers latch the received data in their internal latches. Furthermore, when a read operation is performed, the I/O circuit 170 externally outputs data received from the page buffers of the page buffer group 150 via the column selector 160.

The P/F check circuit 180 checks whether input data is identical with data stored in memory cells through a program loop and outputs a result of the check as a check signal PFC. In other words, the P/F check circuit 180 may check whether an error, e.g., a failed cell exists, having a threshold voltage lower than a target voltage, exists in memory cells for which a program operation has been performed in a program verification operation performed after the program operation and outputs a result of the check as the check signal PFC. If, as a result of the check, the input data is identical with the data stored in the memory cells (that is, an error cell, having a threshold voltage lower than a target voltage, exists in the memory cells for which the program operation has been performed), the P/F check circuit 180 outputs the check signal PFS to the control circuit 120 so that a program loop can be performed again.

The error bit check circuit 190 determines whether the number of error bits of data not identical with input data, from among data stored in memory cells, is greater than or equal to or smaller than the number of correctable error bits. Here, the number of correctable error bits may be a maximum number of error bits that is corrected by an error correction code (ECC). According to an example, the error bit check circuit 190 may compare the number of error bits with the number of correctable error bits by comparing the amount of current, outputted from the page buffers based on the program verification result after the completion of the program verification, with the amount of reference pass current corresponding to the number of correctable error bits. Furthermore, when the error bit check circuit 190 determines that the number of error bits is equal to or smaller than the number of correctable error bits, a program loop is no longer performed and bits in error can be corrected by the ECC.

Furthermore, according to an example, the error bit check circuit 190 determines whether the number of error bits of data not identical with the input data, from among the data stored in memory cells, is greater than the reference number of bits for replacement determination or equal to or smaller than the reference number of bits for replacement determination bits, based on the verification result stored for each of the page buffers of the page buffer group 150 under the control of the control circuit 120. For example, the error bit check circuit 190 may compare the number of error bits with the reference number of bits for replacement determination by comparing the amount of current, outputted from the page buffers based on the program verification result, with the amount of reference replacement current lower than the amount of reference pass current.

As described above, the control circuit 120 controls the operation circuit group (130, 140, 150, 160, 170, and 180) and the error bit check circuit 190 for the data I/O operations of the memory cells. For example, the control circuit 120 generates the internal command signal CMDi in response to a command signal CMD and generates control signals PS SIGNALS for controlling the page buffers of the page buffer group 150 according to the type of an operation. Furthermore, the control circuit 120 internally generates the row address signal RADD and the column address signal CADD in response to an address signal ADD. Furthermore, the control circuit 120 checks whether the threshold voltages of selected memory cells have risen to a minimum target voltage in response to the check signal PFS of the P/F check circuit 180 in a program verification operation and determines whether to perform a program operation again or to terminate the program operation based on a result of the check The control circuit 120 controls a level of the program voltage Vpgm supplied to a selected word line, when a program operation for selected memory cells is performed, and also controls the voltage generator 130 so that a level of the verification voltage Vpv supplied to the selected word line can be changed when a program verification operation is performed. Here, the control circuit 120 may control the voltage generator 130 in response to the check signal PFS of the P/F check circuit 180.

In particular, when the number of error bits is equal to or smaller than the number of correctable error bits, but greater than the reference number of bits for replacement determination, the control circuit 120 controls the operation circuit group (130, 140, 150, 160, 170, and 180) in order to add the column address of a memory cell, having an error bit stored therein, to failed column address information stored in the CAM block 110C. A detailed operation of the control circuit 120 controlling the operation circuit group will be described later.

Meanwhile, the CAM latch circuit 200 latches failed column address information read from the extra block, e.g., the CAM block 110C. Furthermore, when a failed column is selected during a data input operation or a data output operation, the CAM latch circuit 200 supplies failed column address information to the control circuit 120 or the column selector 160 so that the failed column can be replaced with the redundancy column. In terms of the operating speed, it is very advantageous for the CAM latch circuit 200 to latch failed column address information and then supply the failed column address information to the control circuit 120, rather than the extra block 110C reading failed column address information and supplying the read failed column address information to the control circuit 120. Meanwhile, when power starts being supplied, the operation circuit group (130, 140, 150, 160, 170, and 180) reads the failed column address information from the extra block 110C and supplies the read failed column address information to the CAM latch circuit 200, under the control of the control circuit 120.

Hereinafter, a method of operating the semiconductor memory device constructed as above is described below.

Figure 2:
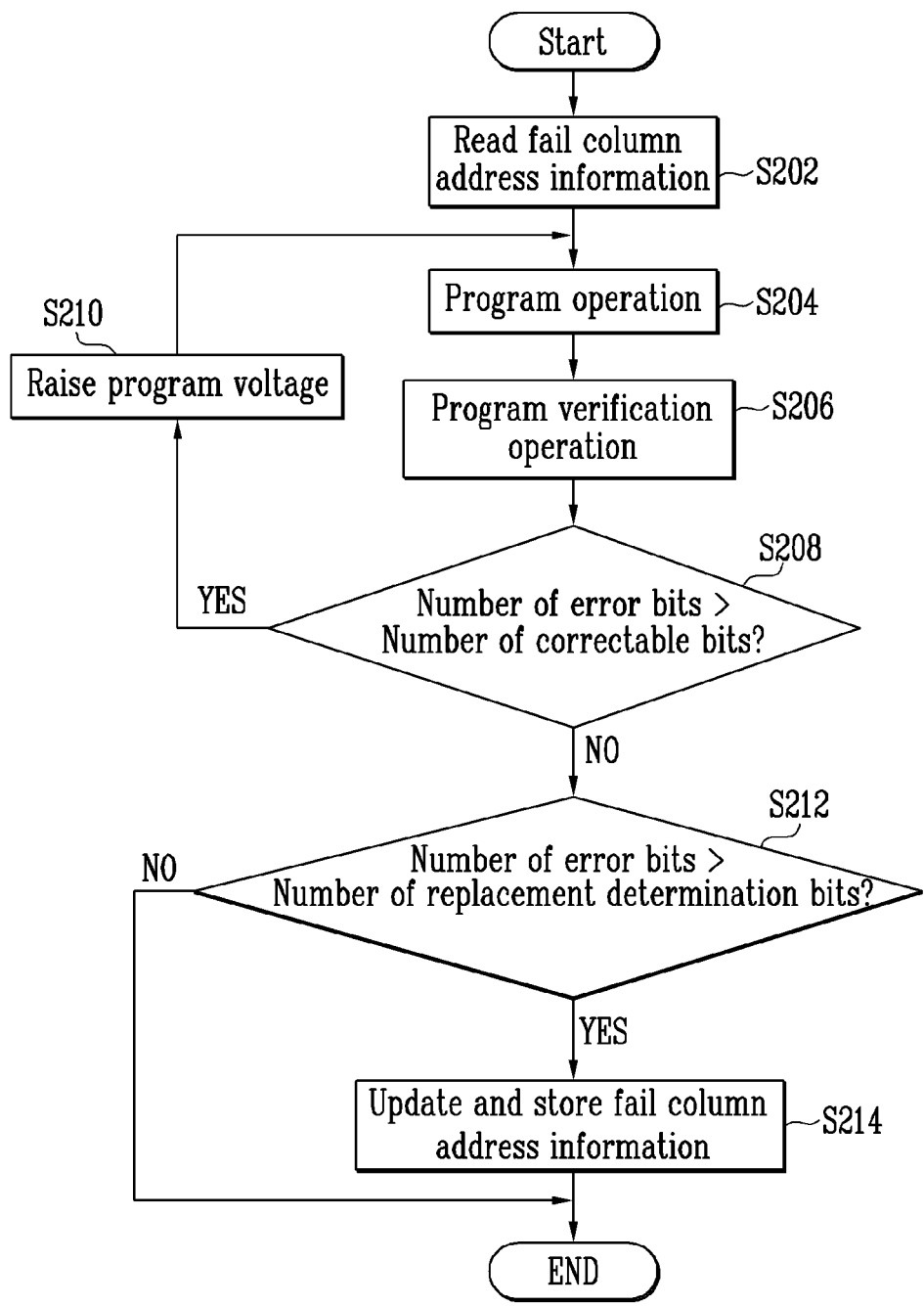
FIG. 2 is a flowchart illustrating a method of operating the semiconductor memory device according to an exemplary embodiment of this disclosure.

FIG. 2 is a flowchart illustrating the method of operating the semiconductor memory device according to an exemplary embodiment of this disclosure.

Referring to FIGS. 1 and 2, at step S202, when power starts being supplied, the control circuit 120 reads failed column address information from the extra block 110C and controls the operation circuit group (130, 140, 150, 160, 170, 180) so that the read failed column address information is latched in the CAM latch circuit 200.

At step S204, a program operation for storing input data in selected memory cells is performed in response to the address signal ADD.

At step S206, a program verification operation for checking whether the data stored in the selected memory cells is identical with the input data is performed. That is, the program verification operation is performed in order to check whether threshold voltages of the selected memory cells are higher than a target voltage. At step S208, a first error bit check operation is performed in order to compare the number of error bits of data not identical with the input data, from among the data stored in the selected memory cells, with the number of correctable error bits is performed. To this end, as described above, the error bit check circuit 190 may compare the number of error bits with the number of correctable error bits by comparing the amount of current, outputted from the page buffers based on a program verification result after the program verification operation, with the amount of reference pass current corresponding to the number of correctable error bits. The first error bit check operation may be performed after a predetermined number of the program operations and the program verification operations are performed.

If, as a result of the comparison at step S208, the number of error bits is greater than the number of correctable error bits, it corresponds to a program fail. Accordingly, a program voltage supplied to the selected memory cells for the program operation is raised by a predetermined value (that is, a step voltage) at step S210. Next, the process returns to steps S204 and S206 in which a program operation and a program verification operation are performed again.

If, as a result of the comparison at step S208, the number of error bits is equal to or smaller than the number of correctable error bits, the program operation and the program verification operation are no longer performed and a second error bit check operation is performed.

At step S212, the second error bit check operation is performed in order to compare the number of error bits with the reference number of bits for replacement determination. To this end, as described above, the error bit check circuit 190 may compare the number of error bits with the reference number of bits for replacement determination by comparing the amount of current, outputted from the page buffers based on a program result, with the amount of reference replacement current lower than the amount of reference pass current.

If, as a result of the comparison at step S212, the number of error bits is greater than the reference number of bits for replacement determination, the failed column address information is updated by adding the column address of a memory cell, having the error bits stored therein, to the failed column address information at step S214. For example, in order to add the column address of a memory cell, having an error bit stored therein, to the failed column address information stored in the extra block 110C, the control circuit 120 controls the operation circuit group (130, 140, 150, 160, 170, and 180) so that the program loop of the extra block 110C is performed.

If, as a result of the comparison at step S212, the number of error bits is equal to or smaller than the reference number of bits for replacement determination, it is not necessary to update the failed column address information.

According to the embodiments of this disclosure, the life span of a memory device and reliability of an operation of the memory device can be improved by performing an update operation for storing the column address of an additional failed column in failed column address information.

What is claimed is:

1. A method of operating a semiconductor memory device, the method comprising:
 performing a program loop, including a program operation for storing input data in selected memory cells and a program verification operation for checking whether a data stored in the selected memory cells is identical with the input data;
 performing a first error bit check operation for comparing a number of error bits of data not identical with the input data, from among the data stored in the memory cells, with a number of correctable error bits;
 if the number of error bits is equal to or smaller than the number of the correctable error bits as a comparison result of the first error bit check operation, performing a second error bit check operation for comparing the number of the error bits with a reference number of error bits for replacement determination after performing the first error bit check operation; and
 if the number of error bits is greater than the reference number of error bits as comparison results of the second error bit check operation and if the number of error bits is equal to or smaller than the number of the correctable error bits as the comparison result of the first error bit check operation, updating failed column address information by adding a column address of a memory cell having the error bit, to the failed column address information.

2. The method of claim 1, wherein if the number of error bits is equal to or smaller than the number of correctable error bits, the program loop is stopped.

3. The method of claim 1, wherein the first error bit check operation is performed after the program loops are performed for a predetermined number of times.

4. The method of claim 3, wherein whenever the program loop is performed, a level of a program voltage supplied to the selected memory cells for the program operation is raised by a predetermined step voltage.

5. The method of claim 1, wherein: the failed column address information is read from a nonvolatile memory block and stored in a register, and the updated failed column address information is stored in the nonvolatile memory block.

6. A semiconductor memory device, comprising:
a memory array comprising a memory block including memory cells for storing input data and an extra block for storing failed column address information;
an operation circuit group configured to perform a program loop for the memory block or the extra block, the program loop including a program operation for storing input data in selected memory cells and a program verification operation for checking whether a data stored in the selected memory cells is identical with the input data;
an error bit check circuit configured to perform a first error bit check operation for comparing a number of error bits of data not identical with the input data, from among the data stored in the selected memory cells of the memory block, with a number of correctable error bits and perform a second error bit check operation for comparing the number of the error bits with a reference number of error bits for replacement determination after performing the first error bit check operation if the number of the error bits is equal to or smaller than the number of the correctable error bits as a comparison result of the first error bit check operation; and
a control circuit configured to control the operation circuit group in order to add a column address of a memory cell having the error bit, to the failed column address information stored in the extra block, if the number of error bits is equal to or smaller than the number of the correctable error bits and greater than the reference number of the error bits after performing the first and second error bit check operations,
wherein if the number of the error bits is greater than the number of the correctable error bits, the operation circuit group is repeatedly performed the program loop until the number of the error bits is equal to or smaller than the number of the correctable error bits.

7. The semiconductor memory device of claim 6, further comprising a latch circuit configured to latch the failed column address information stored in the extra block and supply the failed column address information to the control circuit or the operation circuit group in a read operation of the memory cells.

8. The semiconductor memory device of claim 6, wherein the control circuit controls the error bit check circuit so that the error bit check circuit compares the number of the error bits with the reference number of the error bits for replacement determination, if the number of the error bits is equal to or smaller than the number of correctable error bits.

9. The semiconductor memory device of claim 6, wherein the control circuit controls the error bit check circuit so that the error bit check circuit compares the number of the error bits with the number of the correctable error bits, after the operation circuit group performs the program loops for a predetermined number of times.

10. The semiconductor memory device of claim 6, wherein the operation circuit group performs the program loop of the extra block in order to add a column address of a memory cell having the error bit, to the failed column address information stored in the extra block.

11. The semiconductor memory device of claim 7, wherein the latch circuit is a CAM latch.

* * * * *